(12) United States Patent
Moto

(10) Patent No.: US 8,649,406 B2
(45) Date of Patent: Feb. 11, 2014

(54) SHUNT DRIVER CIRCUIT FOR LASER DIODE WITH PUSH PULL ARCHITECTURE

(71) Applicant: Sumitomo Electric Industries, Ltd., Osaka (JP)

(72) Inventor: Akihiro Moto, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/689,292

(22) Filed: Nov. 29, 2012

(65) Prior Publication Data
US 2013/0156056 A1 Jun. 20, 2013

Related U.S. Application Data

(63) Continuation-in-part of application No. 13/282,131, filed on Oct. 26, 2011, now Pat. No. 8,571,078.

(30) Foreign Application Priority Data

Oct. 28, 2010 (JP) ................................. 2010-242342
Sep. 7, 2011 (JP) ................................. 2011-194924
Nov. 29, 2011 (JP) ................................. 2011-260257

(51) Int. Cl.
*H01S 3/00* (2006.01)

(52) U.S. Cl.
USPC ...................................... 372/38.02; 372/38.07

(58) Field of Classification Search
USPC ............................................ 372/38.02, 38.07
See application file for complete search history.

(56) References Cited

U.S. PATENT DOCUMENTS 5,546,218 A * 8/1996 Komatsubara et al. ........ 359/237
2013/0094530 A1 * 4/2013 Nakashima et al. ......... 372/38.02

FOREIGN PATENT DOCUMENTS

JP 2011-023474 A 2/2011

* cited by examiner

*Primary Examiner* — Kinam Park
(74) *Attorney, Agent, or Firm* — Venable LLP; Michael A. Sartori

(57) ABSTRACT

A shunt driver for driving an LD is disclosed. The shunt driver has the push-pull architecture with the high side driver and the low side driver. The high side driver is driven by a positive phase signal superposed with a signal with a phase opposite to the negative phase signal. The low side driver is driven by a negative phase signal superposed with a signal with a phase opposite to the positive phase signal. Adjusting the magnitude of the superposed signals, the driving current for the LD has the peaking in the rising and falling edges thereof.

10 Claims, 8 Drawing Sheets

SHUNT DRIVER CIRCUIT FOR LASER DIODE WITH PUSH PULL ARCHITECTURE

CROSS REFERENCE TO RELATED APPLICATIONS

This application is a continuous-in-part of a prior application of Ser. No. 13/282,131, filed Oct. 26, 2011, which is hereby incorporated by reference herein in its entirety.

BACKGROUND OF THE INVENTION

1. Field of the Invention

The present application relates to a driver for driving a semiconductor laser diode (hereafter denoted as LD).

2. Related Background Arts

A LD driver with, what is called as, the shunt driver has been well known in the field. However, the shunt driver has a subject that it is unavoidable to enhance the trans-conductance. In order to get an enough trans-conductance, the driver has, in an output stage thereof, a MOS transistor with a wider gate width, or a bipolar transistor with a large collector and base size, which inevitably increases parasitic input capacitance and degrades the high frequency performance. The present application is to provide a technique to enhance the high frequency performance of the shut driver for an LD.

SUMMARY OF THE INVENTION

The present application relates to a driver for an LD. The driver, which is driven by input signals with a positive phase and a negative phase, has architecture of, what is called as, the push pull driver or shunt driver to provide a push current to the LD or extract pull current from the LD. The driver includes a positive buffer, a negative buffer, a high side driver, and a low side driver. The positive buffer generates a first positive signal and a first negative signal from the input signal with the positive phase. The negative buffer generates a second positive signal and a second negative phase signal from the input signal with the negative phase. The high side driver is driven by the first positive phase signal superposed with the second positive signal to generate the push current provided to the LD, while, the low side driver is driven by the second negative signal superposed with the first negating signal to generate the pull current extracted from the LD.

The high side driver provides a transistor driven by the first positive signal superposed with the second positive signal, and the low side driver provides a transistor driven by the second negative signal superposed with the first negative signal. The transistor in the high side driver and the transistor in the low side driver are connected in series such that the LD is coupled with a node between two transistors. The transistor in the high side driver maybe an n-type MOSFET, and the transistor in the low side driver may be an npn-type bipolar transistor.

The high side driver may further include another transistor with a p-type MOSFET connected between the node and the n-type MOSFET. The push current is provided from the drain of the p-type MOSFET. These transistors, the n-type MOSFET, the p-type MOSFET, and the npn-type bipolar transistor are individually biased.

Moreover, the positive buffer includes a bipolar transistor, a base of which receives the input signal with the positive phase, an emitter of which outputs the first positive signal, and a collector of which outputs the first negative signal. The negative buffer also includes a bipolar transistor, a base of which receives the input signal with the negative phase, an emitter thereof outputs the second negative signal, and a collector thereof outputs the second positive signal. The first positive signal and the second positive signal are provided to the high side driver via respective capacitors, and the first negative signal and the second negative signal are provided to the low side driver via respective capacitors. The driver may further provide a high side emitter follower and a low side emitter follower.

The high side emitter follower may buffer the collector of the transistor in the negative buffer. The low side emitter follower may buffer the collector of the transistor in the high side driver. The emitter of the positive buffer is coupled with the high side driver via a delay line, and the emitter of the negative buffer is coupled with the low side driver with a delay line, where the delay lines have a delay period substantially equal to a delay of respective emitter followers.

BRIEF DESCRIPTION OF THE DRAWINGS

Other features and advantages of the present invention will become more apparent from the following detailed description of embodiments herein disclosed by way of example with reference to the attached drawings, in which.

DESCRIPTION OF PREFERRED EMBODIMENTS

Next, some preferred embodiments of the present invention will be described as referring to drawings. In the description of the drawings, numerals or symbols same or similar to each other will refer to elements similar to same to each other without overlapping explanations. An optical transmitter 1 according to an embodiment receives an electrical signal and generates an optical signal corresponding to the electrical signal, which is often called as a transmitter optical subassembly (hereafter denoted as TOSA). The optical transmitter 1 provides a driver 3 with the configuration of, what is called, the push-pull architecture.

Figure 1:
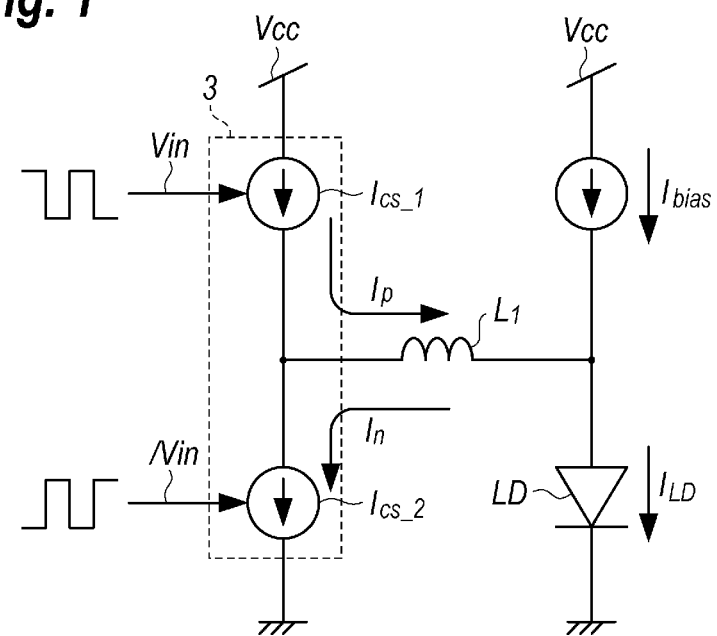
FIG. 1 explains a mechanism of the push pull driver for an LD.

A basic mechanism of the push-pull architecture implemented within the optical transmitter 1 will be first explained by referring to FIG. 1. The optical transmitter 1 includes the driver 3 and a light-emitting device, which is generally an LD. The driver 3 includes a voltage controlled current source $I_{CS\_1}$ and another voltage controlled current source $I_{CS\_2}$. The first current source $I_{CS\_1}$ is put in a side of the positive power supply Vcc; while, the second current source $I_{CS\_2}$ is put in another side of the ground (GND). The LD is supplied with a bias current $I_{bias}$, which is a DC bias, from a current source put outside of the driver 3. The magnitude of the bias current $I_{bias}$ is controlled by an auto power control (hereafter denoted as APC) circuit that determines the average output power of the optical signal output from the LD, which is different from an ordinary driver architecture where a bias current determines the low level of the optical signal. The LD is directly grounded GND in the cathode thereof; while, it is connected in the anode thereof to two current sources, $I_{CS\_1}$ and $I_{CS\_2}$, via a bonding wire $B_1$.

The first current source $I_{CS\_1}$ outputs a current $I_p$, which corresponds to a positive phase signal Vin, to the LD via the bonding wire $B_1$. Here, the term "positive" merely means that the signal has a positive phase relative to the signal with the negative one. The LD, by receiving the positive current $I_p$, becomes active to emit light supplied with a superposed current $I_{bias}+I_p$, which exceeds the bias current $I_{bias}$. The second current source $I_{CS\_2}$, by receiving the negative phase signal /Vin, generates a negative current $I_n$ to extract the bias current $I_{bias}$ from the LD via the bonding wire $B_1$. Then, the LD is driven by an extracted current, $I_{bias}-I_n$, less than the bias current $I_{bias}$. In the description above, the symbol "/" means that a signal denoted thereby has a phase opposite to another signal without this symbol "/".

Figures 2A, 2B:
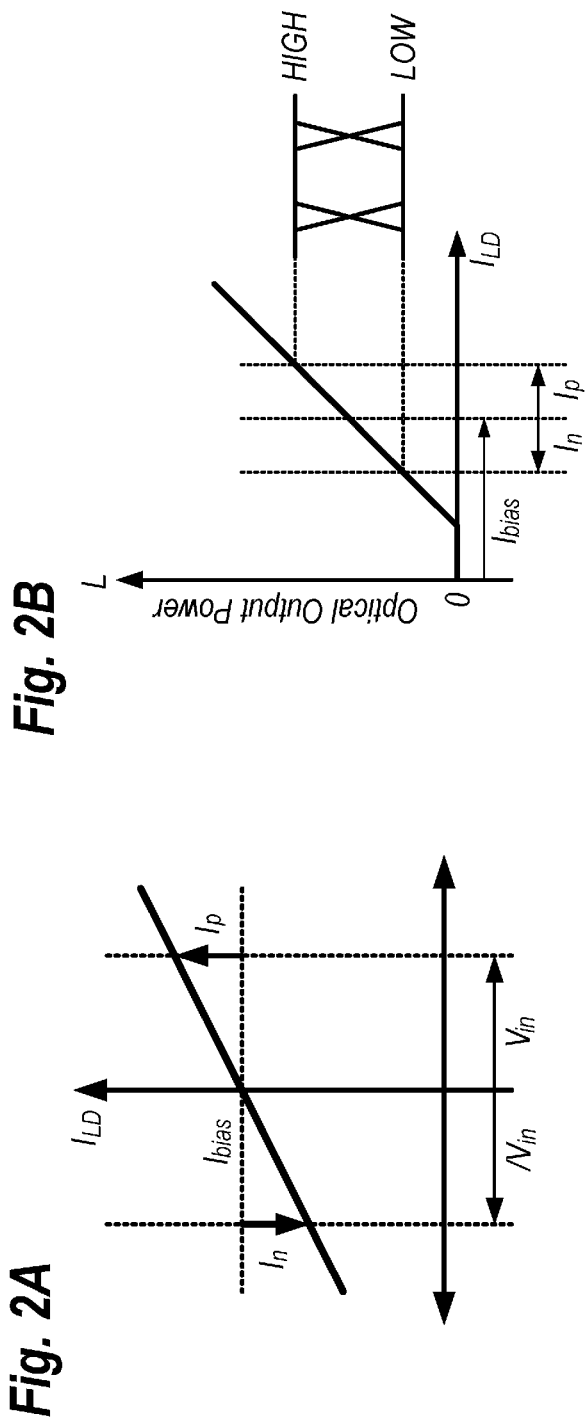
FIG. 2A shows how the superposed current $I_{bias}+I_p$ and the extracted current $I_{bias}-I_n$ are created.
FIG. 2B shows how two optical states, HIGH and LOW, are created by two currents, $I_{bias}+I_p$ and $I_{bias}-I_n$.

FIG. 2A shows two states of the LD each driven by the superposed current $I_{bias}+I_p$ and the extracted current $I_{bias}-I_p$. The positive current $I_p$ is modulated by the positive signal Vin; while, the negative current $I_n$ is modulated by the negative signal /Vin, where two signals, Vin and /Vin, have an amplitude same to the others but the phases are opposite to the others.

The operation of the driver 3 will be further described. When the positive signal Vin is in HIGH, which means that the negative signal /Vin is in LOW where the first current source $I_{CS\_1}$ is active but the second current source $I_{CS\_2}$ is inactive, the current $I_p$ flows in the LD via the bonding wire $B_1$; then, the current flowing in the LD becomes the superposed current $I_{bias}+I_p$. On the other hand, when the negative signal /Vin is in HIGH, which means that the positive signal Vin is in LOW, that is, the first current source $I_{CS\_1}$ becomes in active but the second current source $I_{CS\_2}$ is active; the current supplied to the LD is subtracted by the current $I_n$ from the bias current $I_{bias}$. Then, the current flowing in the LD becomes $I_{bias}-I_n$. Thus, the LD is modulated by the signals, Vin and /Vin, complementary to each other between two levels, HIGH and LOW, as shown in FIG. 2B.

Figure 3:
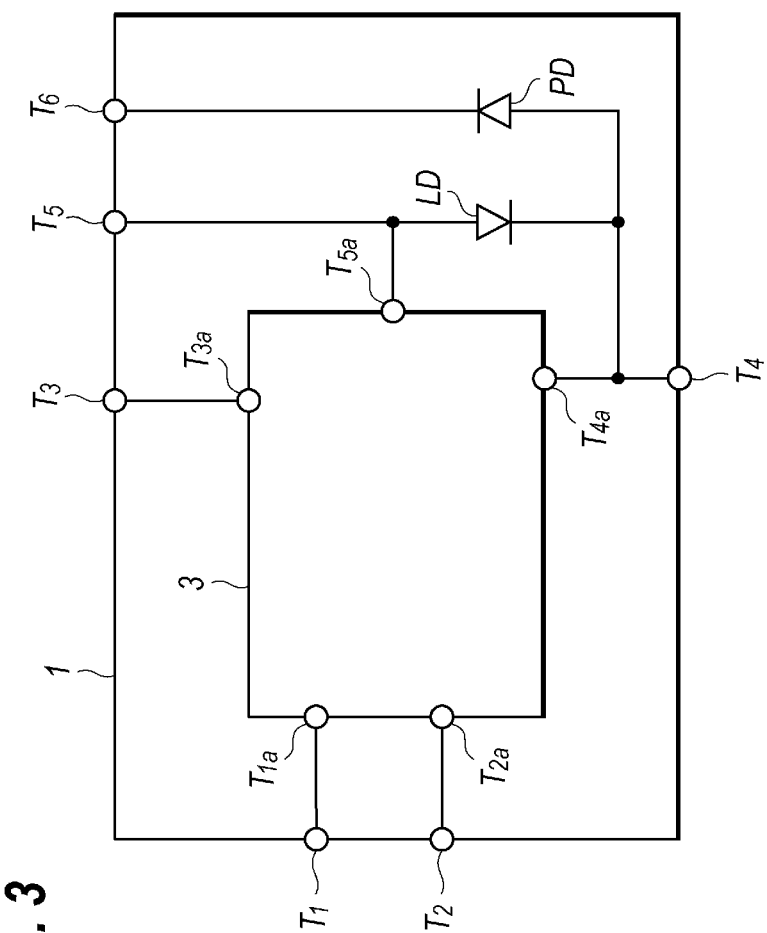
FIG. 3 is a block diagram of an LD driver with the shut drive arrangement.

FIG. 3 is a block diagram of the optical transmitter 1, which includes a driver 3, an LD, and a photodiode (hereafter denoted as PD). The optical transmitter 1 shown in FIG. 3 is a type of the TOSA where whole electrical elements above described, the driver, LD, and PD, are installed within a package of the optical transmitter 1. The driver 3, by receiving driving signals, Vin and /Vin, generates tow currents, $I_p$ and $I_n$, sequentially. The PD monitors portion of light emitted from the LD to operate the APC circuit.

The optical transmitter 1 has terminals, $T_1$ to $T_6$. $T_{wo}$ terminals, $T_1$ and $T_2$ receive the positive and negative signals, Vin and /Vin from an external circuit. The terminal $T_3$ is biased by the power supply Vcc; while, the terminal $T_4$ is grounded. The $T_5$ receives the bias current $I_{bias}$ from the external source via an inductor, which is generally the bonding wire shown in FIG. 1, and the terminal $T_6$ is provided for monitoring the output of the PD to operate the APC circuit. The cathode of the LD is connected not only to the ground in the driver 3 but to the terminal $T_4$, which is connected to the external ground.

The driver 3, which modulates the driving current $I_{LD}$ supplied to the LD responding to the input differential signals, provides terminals, $T_{1a}$ to $T_{3a}$, each connected to corresponding terminals of the optical transmitter 1. Specifically, terminals, $T_{1a}$ and $T_{2a}$, receive the differential signals, Vin and /Vin, respectively. The terminal $T_{3a}$ is provided with the positive power supply Vcc via the terminal $T_3$, $T_{4a}$ is grounded, and $T_{5a}$, which connected to the anode of LD, outputs the current $I_p$ or absorbs another current $I_n$.

The driver 3 includes a high side driver and a low side driver. The high side driver, which is put between the terminals, $T_{1a}$ and $T_{5a}$, provides the push current $I_p$ responding to the positive phase signal Vin. While, the low side driver, which is put between the terminals, $T_{2a}$ and $T_{5a}$, absorbs the extracted current $I_n$ responding to the negative phase signal /Vin. The high side driver includes the first current source $I_{CS\_1}$ and a positive buffer including an emitter follower put in the upstream of the first current source $I_{CS\_1}$. While, the low side driver includes the second current source $I_{CS\_2}$ and a negative buffer including an emitter follower put in the upstream of the second current source $I_{CS\_2}$.

A conventional driver with the arrangement of, what is called, the shunt driver provides one input terminal and one output terminal. The driver 3 according to an embodiment has the architecture of the push-pull type that provides two input terminals, $T_{1a}$ and $T_{2a}$, and the one output terminal $T_{5a}$. $T_{wo}$ input terminals receive the differential signal, which not only doubles the sensitivity of the driver 3 equivalently but inherently has a substantial gain. Accordingly, the driver 3 with the push-pull architecture may be driven by the input signals with smaller magnitude, makes the amplitude of the output current half of the modulation current for the LD, which reduces the power consumption of the driver 3, and is unnecessary to use, for MOS transistors with a long gate width to get a substantial trans-conductance.

First Embodiment

Figure 4:
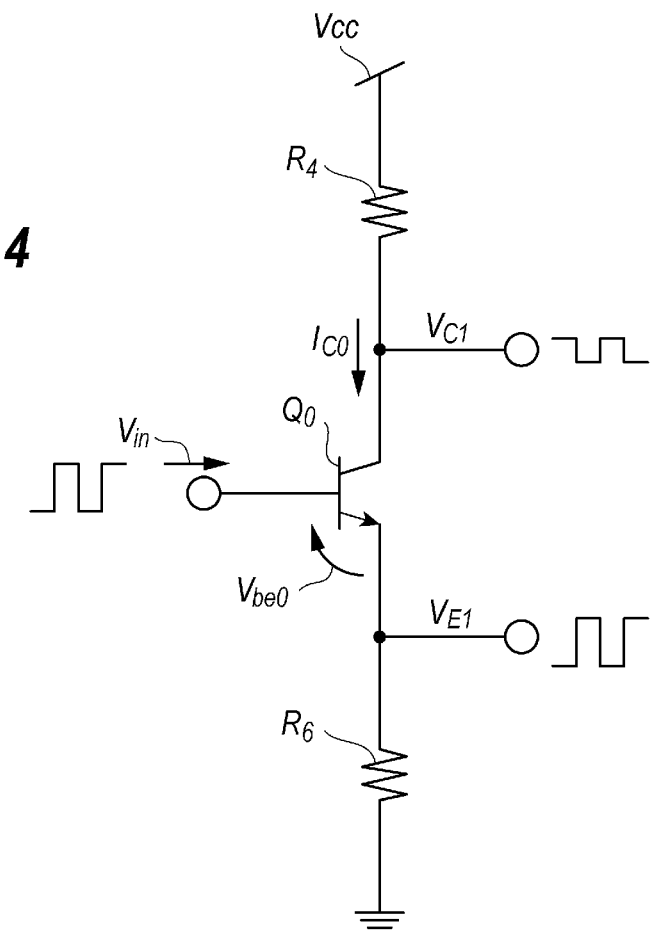
FIG. 4 explains a mechanism to generate two signals with phases opposite to each other by an emitter follower.
Figure 5:
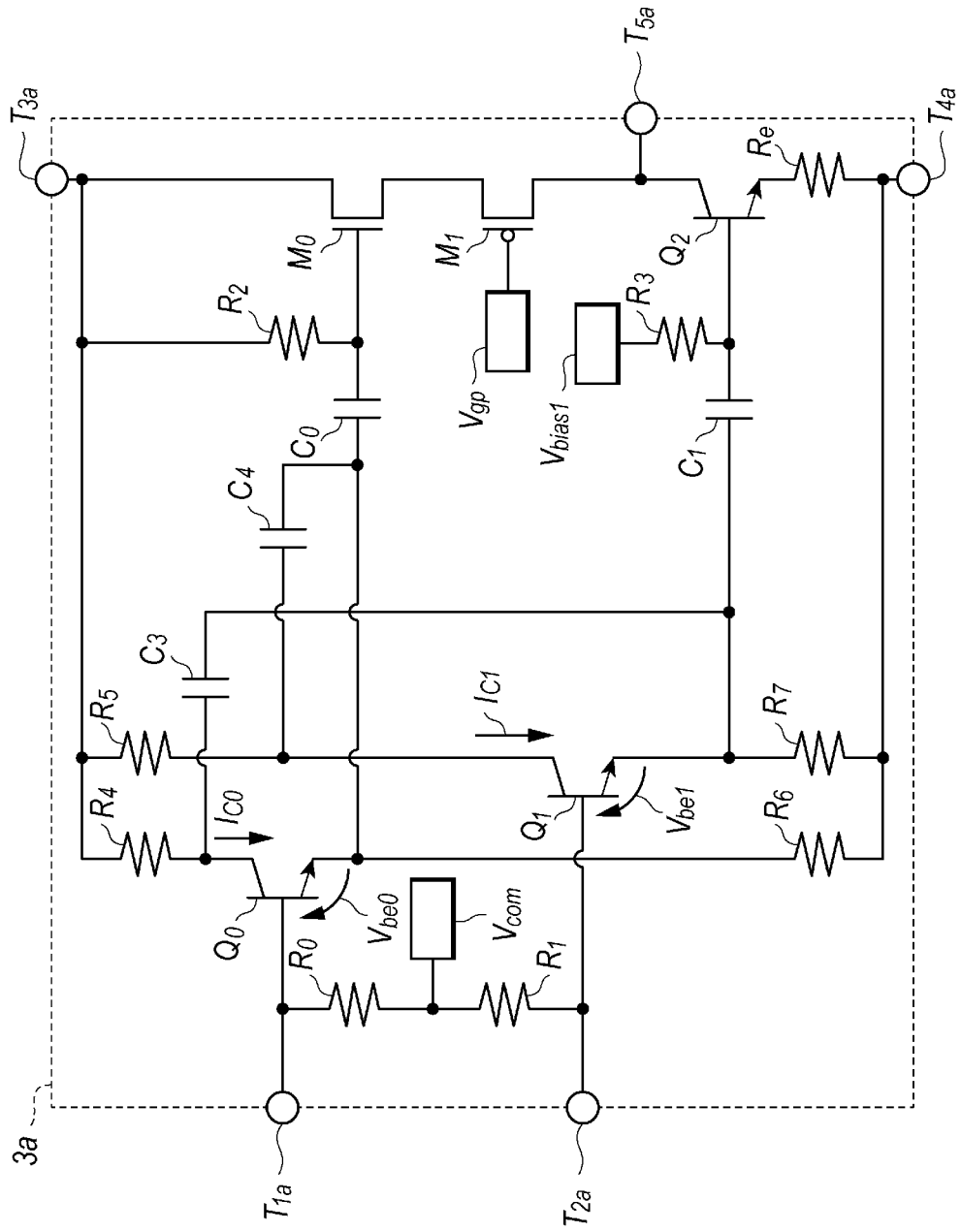
FIG. 5 is a circuit diagram of a driver with the push pull architecture according to an embodiment of the invention.
Figure 6:
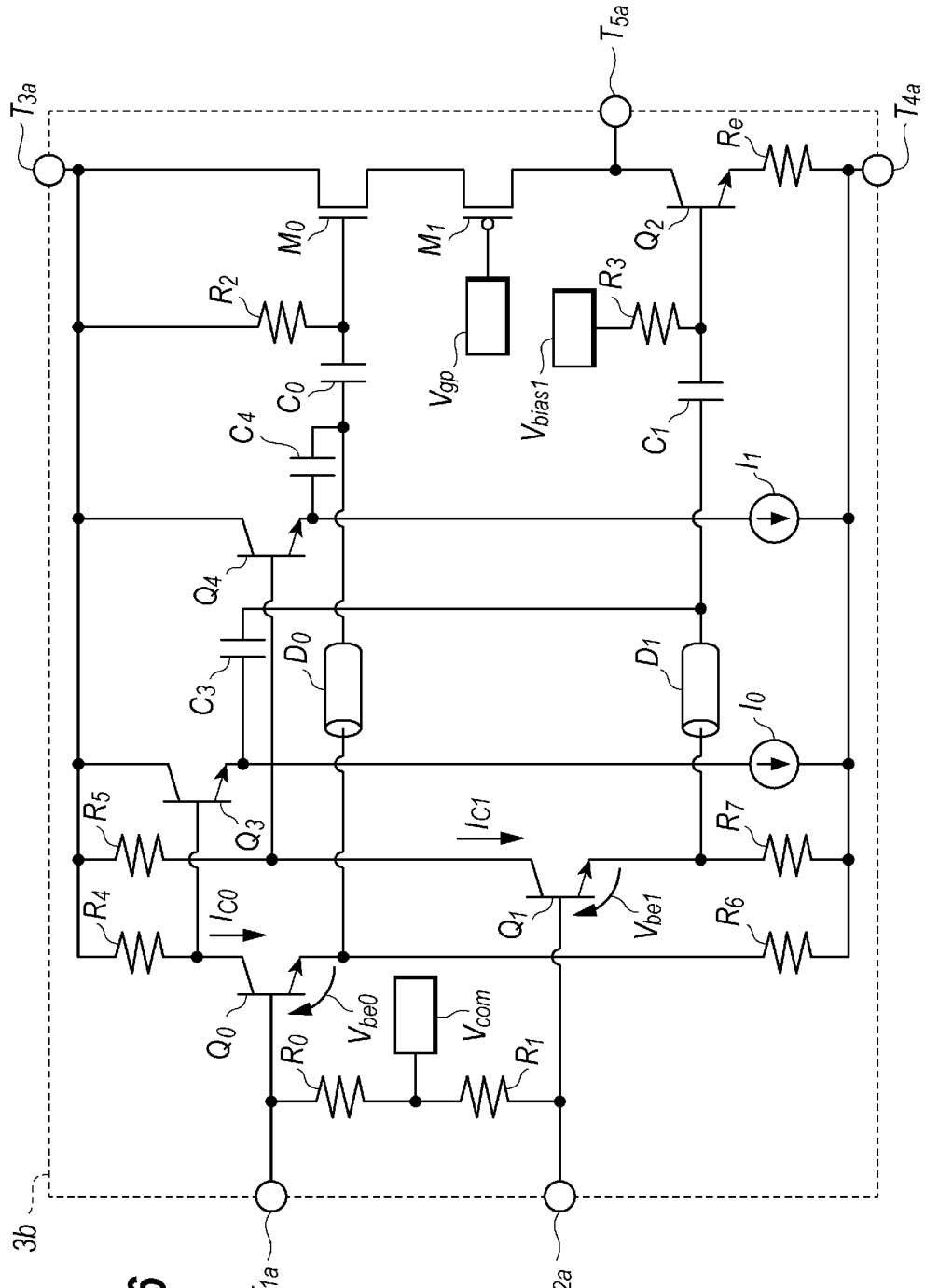
FIG. 6 is a circuit diagram of another driver also with the push pull architecture.

Next, some specific embodiments for the driver 3 will be described. FIGS. 5 and 6 shows circuit diagrams of the driver according to embodiments of the invention; while, FIG. 4 shows a circuit diagram of a modified emitter follower extracted from the positive buffer shown in FIGS. 5 and 6. The emitter follower shown in FIG. 4 is put in the upstream of the push-pull circuit constituted by two current sources, $I_{CS\_1}$ and $I_{CS\_2}$. The emitter follower has an npn-transistor $Q_0$ with the base receiving the input signal, Vin or /Vin, the emitter grounded via a resistor $R_6$, and the collector biased with the power supply Vcc via another resistor $R_6$.

Assuming the base bias current is far less than the collector current, the current coming in the collector, which is the collector current, becomes the current outgoing from the emitter, which is the emitter current. Increasing the base current, both collector and emitter currents increase; then, the collector bias falls but the emitter bias rises because of the collector current flowing in the resistor $R_4$ and the emitter current flowing in the resistor $R_6$. The change of respective biases of the collector and the emitter becomes equal to the others but the phases between them are opposite. That is, the emitter of the transistor $Q_0$ outputs a signal $V_{E1}$ with the positive phase, while, the collector thereof generates another signal $V_{C1}$ with the negative phase. A ratio of the resistance of two resistors, $R_4$ and $R_6$, determined the ratio of the amplitude of two output signals, $V_{C1}$ and $V_{E1}$. That is, an equation below is satisfied:

$$V_{C1}/V_{E1}=R_4/R_6.$$

The driver 3a will be described as referring to FIG. 5. The driver 3a includes resistors, $R_0$ to $R_7$ and $R_e$, capacitors, $C_0$ to $C_4$, and transistors, $Q_0$ to $Q_2$, $M_0$ and $M_1$, where transistors, $Q_0$ to $Q_2$ are npn bipolar transistors, $M_0$ is an n-type MOSFET (Metal-Oxide-Semiconductor Field-Effect-Transistor), and $M_1$ is a p-type MOSFET. The driver 3a further includes bias supplies of $V_{COM}$, $V_{bias1}$ and $V_{gp}$.

The transistor $Q_0$, and two resistors, $R_4$ and $R_6$, constitute a positive buffer with the arrangement shown in FIG. 4. The transistor $Q_1$, two resistors, $R_5$ and $R_7$, constitute a negative buffer with the arrangement shown in FIG. 4. The high side driver, namely, the transistor $M_0$ receives in the gate thereof a positive phase signal from the emitter of transistor $Q_0$ in the positive buffer via the capacitor $C_0$ and from the collector of the transistor $Q_1$ in the negative buffer as a signal with a phase opposite to the negative phase signal via capacitors, $C_4$ and $C_0$. The low side driver, namely, the transistor $Q_2$ receives in the base thereof a negative phase signal from the emitter of the transistor $Q_1$ in the negative buffer via the capacitor $C_1$ and from the collector of the transistor $Q_0$ in the positive buffer via the capacitors, $C_3$ and $C_1$.

The first current source $I_{CS\_1}$ in FIG. 1 includes the transistors, $M_0$ and $M_1$, a resistor $R_2$, and the bias $V_{gp}$. The second current source $I_{CS\_2}$ in FIG. 1 includes the transistor $Q_2$, resistors, $R_3$ and Re. and the bias $V_{bias1}$.

In the transistor $Q_0$, the base thereof receives the positive input signal Vin from the terminal $T_{1a}$, the collector being biased by the power supply from the terminal $T_{3a}$ via the resistor $R_4$, and the emitter being grounded by the terminal $T_{4a}$ Via the resistor $R_6$. Moreover, the collector of the transistor $Q_0$ is coupled in AC mode via the capacitors, $C_3$ and $C_1$, with the base of the transistor $Q_2$ in the low side driver; while, the emitter thereof is coupled in AC mode via the capacitor $C_0$ with the transistor $M_0$ in the high side driver. In the transistor $Q_1$, the base receives the negating phase input signal /Vin from the terminal $T_{2a}$, the collector being biased by the positive power supply from the terminal $T_{3a}$ via the load resistor $R_5$, and the emitter being grounded by the terminal $T_{4a}$ via the resistor $R_7$. Moreover, the collector of the transistor $Q_1$ is coupled in AC mode via the capacitors, $C_4$ and $C_0$, with the transistor $M_0$ in the high side driver, and the emitter thereof is coupled in AC mode via the capacitor $C_1$ with the transistor $Q_2$ in the low side driver. $T_{wo}$ resistors, $R_0$ and $R_1$, not only terminate the input terminals, $T_{1a}$ and $T_{2a}$, but set the bias level to them by the bias source $V_{com}$.

Because the collector currents, $I_{C0}$ and $I_{C1}$, of the transistors, $Q_0$ and $Q_1$, are determined as:

$$I_{C0}=(V_{com}-Vbe_0)/R_6$$

$$I_{C1}=(V_{com}-Vbe_1)/R_7,$$

the bias $V_{com}$ is determined to flow a preset collector current, $I_{C0}$ and $I_{C1}$, in respective transistors, $Q_0$ and $Q_1$, where Vbe is the base-emitter bias of a bipolar transistor and ordinarily given by a forward bias voltage of a p-n junction diode. For instance, setting Vbe, resistance of resistors, and the preset collector current are 0.8 V, 200 Ω, and 4 mA, respectively, the bias $V_{com}$ is determined to be 1.6 V.

Transistors, $M_0$, $M_1$ and $Q_2$ are connected in series between two terminals, $T_{3a}$ and $T_{4a}$. Among them, the MOSFETs, $M_0$ and $M_1$ operate as the push transistors, while, the bipolar transistor $Q_2$ operates as the pull transistor. The transistor $M_0$ coupled with the emitter of the transistor $Q_0$ via the capacitor $C_0$ and the collector of the transistor $Q_1$ via the capacitors, $C_0$ and $C_4$. The gate of the transistor $M_0$ is biased by the power supply Vcc via the terminal $T_{3a}$ and the resistor $R_2$. The transistor $M_1$ is biased by the bias Vgp in the gate thereof. The transistor $Q_2$ in the base thereof is coupled with the emitter of the transistor $Q_1$ via the capacitor $C_1$, also with the collector of the transistor $Q_0$ via the capacitors, $C_3$ and $C_1$. The base of the transistor $Q_2$ is biased by $V_{bias1}$ via the resistor $R_3$.

Although the transistors, $M_0$, $M_1$, and $Q_2$, in the high side driver and the low side driver are necessary to be large in the size thereof to drive the LD or to flow a large current therein, which inevitably increase junction capacitance, namely Cgs and Cgd for a MOSFET, while Cbe and Cbc for a bipolar transistor; the emitter follower constituted by the transistors, $Q_0$ and $Q_1$, enhances the capability to driver those transistors. Then the input terminals, $T_{1a}$ and $T_{2a}$, may be isolated from such large transistors, and the high frequency performance of the driver 3a is maintained.

Moreover, the transistors, $M_0$ and $Q_2$, are doubly driven by the input signal. That is, the transistor $M_0$ in the high side driver is driven by the positive phase signal Vin via the transistor $Q_0$ and also by the negative phase signal /Vin reversed in a phase thereof via the transistor $Q_1$. Thus, the driving signal applied to the gate of the transistor $M_0$ is doubled. Similarly, the transistor $Q_2$ is driven by the negative phase signal /Vin via the transistor $Q_1$, concurrently by the positive phase signal Vin reversed in the phase thereof via the transistor $Q_0$. Thus, both the high side driver $M_0$ and the low side driver $Q_2$ are doubly driven by positive and negative phase signals, which enhance the high frequency performance of the driver 3a.

Transistors, $M_0$. $M_1$, and $Q_2$, in the high side and low side drivers are biased individually by bias supplies, namely, the positive power supply Vcc for the transistor $M_0$, the bias Vgp for the transistor $M_1$, and another bias $V_{bias1}$ for the transistor $Q_2$, at respective optimum conditions. Moreover, both the high side driver $M_0$ and the low side driver $Q_2$ are driven by the transistors, $Q_0$ and $Q_1$, in AC mode via capacitors. Accordingly, the gate, or the base of the drivers are optionally set in their optimum operating points.

The resistance of the resistors, $R_2$ and $R_3$, coupled with the gate and the base of the driving transistors, $M_0$ and $Q_2$, are preferably large enough. Coupling capacitors, $C_0$ to $C_4$, monolithically formed with active elements, $Q_0$ to $Q_2$ and $M_0$ to $M_1$, are restricted in the capacitance thereof. On the other hand, the resistors, $R_2$ and $R_3$, each form a low-cut filter with a cut-off frequency determined by the resistance and the capacitance. The driver 3a, when it is used in the optical communication system, is necessary for the cut-off frequency to be smaller than 100 kHz. Accordingly, to obtain such a cut-off frequency, the resistors, $R_2$ and $R_3$, are preferably to be greater than 100 kΩ, or further preferably greater than 1 MΩ.

Further more, the capacitor $C_0$ and the resistor $R_2$ constitute a differential circuit; while, the capacitors, $C_4$ and $C_0$, and a resistor $R_2$ constitute a differential circuit. Setting the cut-off frequency of the latter differential circuit far higher than that of the former differential circuit, that is, the capacitance of the capacitor $C_4$ is far smaller than that of the capacitance $C_0$, the signal coming from the transistor $Q_1$ becomes positive and negative pulses each appearing in the rising and falling edges of the signal via the transistor $Q_0$. This enhances the high frequency response of the MOSFET $M_0$. Similarly, the contribution of a signal coming from the collector of the transistor $Q_0$ to the base of the pull transistor $Q_2$ is restricted by setting the capacitance of the capacitor $C_3$ far less than that of the capacitor $C_1$, only the rising and falling edges of the negative phase signal supplied to the base of the transistor $Q_2$ may be enhanced.

The transistor $M_1$ has a conduction type opposite to the transistor $M_0$. In the present embodiment, the transistor $M_1$ is a p-MOSFET with the gate biased by $V_{gp}$. Because the source thereof is connected with the source of the transistor $M_0$, which means that the output of the driver 3a is brought from the drain of the transistor $M_1$. Thus, the output impedance of the high side driver is relatively large. In a case where the source of the transistor $M_0$ is coupled directly with the transistor $Q_2$, the transistor $Q_2$ is likely to pull the current from the high side driver not from LD because the source impedance is comparably low.

The driver 3a, because it provides the emitter follower in upstream of the push-pull circuit, inherently shows the power consumption higher than a driver with the type of, what is called, the shunt driver. However, the push-pull architecture, as already described, lowers the bias current $I_{bias}$ supplied to the LD half of conventional shunt driver. Accordingly, the power consumption of the optical transmitter 1 resultantly becomes comparative to conventional optical transmitters.

The driver 3a provides, in the input ports, $T_{1a}$ and $T_{2a}$, thereof, a differential termination, that is, two termination resistors, R0 and R1, are connected between two input ports in series and the intermediate node of two resistors, $R_0$ and $R_1$, is biased by $V_{com}$. However, respective input ports, $T_{1a}$ and $T_{2a}$, are independently biased via a termination resistor.

Second Embodiment

Next, another driver 3b according to the second embodiment of the present invention will be described as referring to FIG. 6. The driver 3b includes, in addition to those of the aforementioned driver 3a, two emitter followers, one of which is comprised of a transistor $Q_3$ and a current source $I_0$, while, the other is comprised of a transistor $Q_4$ and a current source; and two delay lines, $D_0$ and $D_1$. The former emitter follower, which is called as the high side emitter follower, is in downstream of the transistor $Q_0$ processing the positive phase signal Vin, while, the latter emitter follower, which is called as the low side emitter follower, is in downstream of the transistor $Q_1$ that processes the negative phase signal /Vin. These two emitter followers can stabilize the operation of two transistors, $Q_0$ and $Q_1$.

For instance, in a case where the driver 3b removes these two emitter followers, the collector of the transistor $Q_0$ may be influenced by the resistors, $R_7$ and $R_3$, and the emitter of the transistor $Q_1$ via the coupling capacitor $C_3$. Also, the collector of the transistor $Q_1$ may be influenced by the resistors, $R_6$ and $R_2$, and the emitter of the transistor $Q_0$. Putting the emitter followers in the downstream of the collector of the transistors, $Q_0$ and $Q_1$; the collector may be isolated from the emitter of the other transistor. The delay lines compensate the delay caused by the insertion of the emitter followers.

Figure 7:
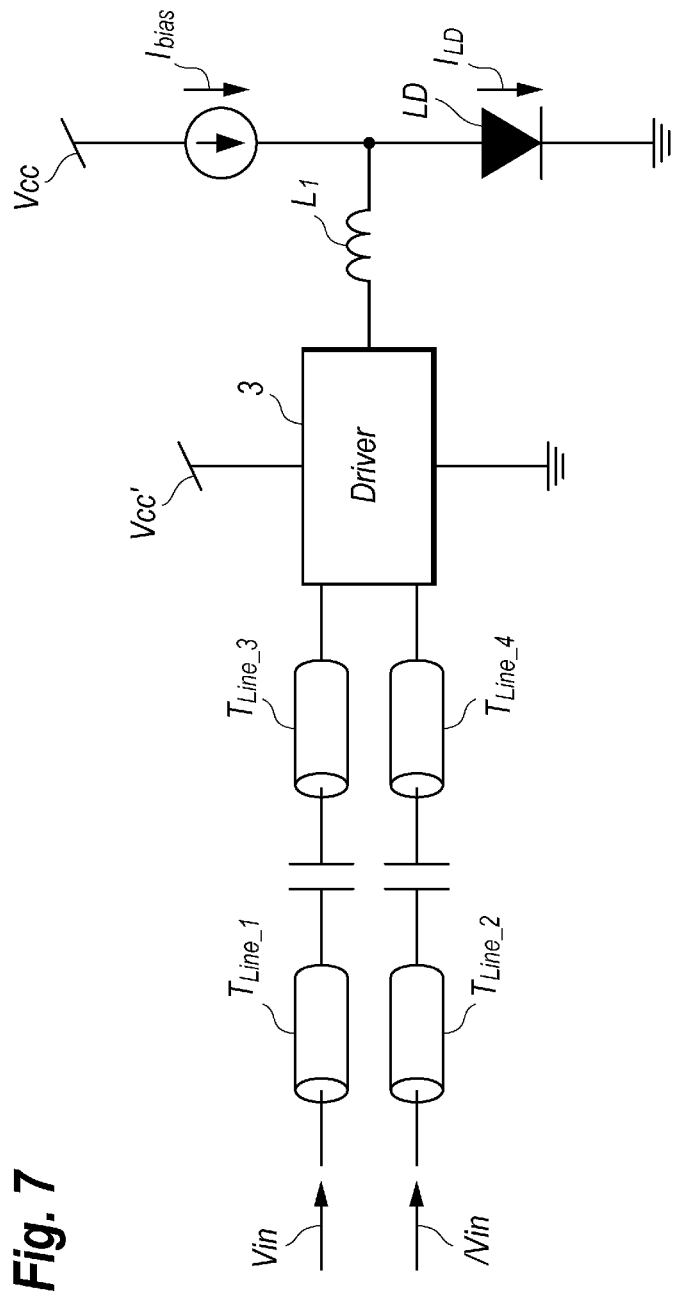
FIG. 7 is a block diagram of a setup to evaluate the frequency dependence of driving current $I_{LD}$ for an LD.
Figure 8:
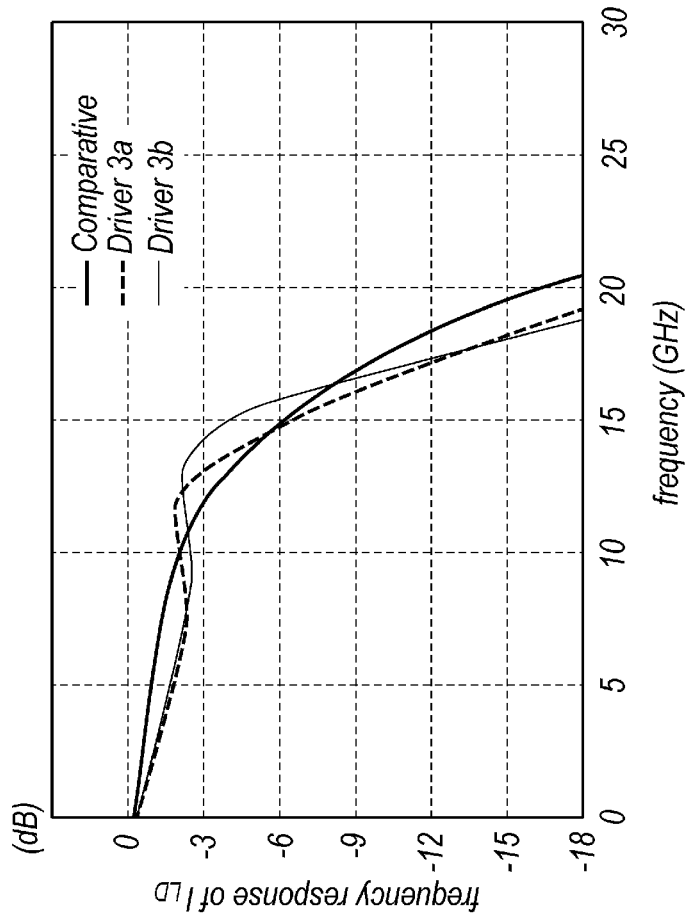
FIG. 8 compares the frequency response of the driving current $I_{LD}$ of the drivers according to embodiments of the invention with a comparative driver without buffers for driving the push pull circuit.

Next, frequency characteristics of the driving current $I_LD$ is evaluated by a circuit shown in FIG. 7, where the circuit includes four transmission lines, $T_{Line\_1}$ to $T_{Line\_4}$ the driver 3, and the bias current source $I_{bias}$. The transmission lines, $T_{Line\_1}$ to $T_{Line\_4}$ show transmission loss of about 0.5 dB at 20 GHz. Two signals, Vin and /Vin, which show sinusoidal shape, are input to the driver via the transmission lines, $T_{Line\_1}$ to $T_{Line\_4}$. The driver 3, responding to two signals, Vin and /Vin, generates the currents, $I_p$ and $I_n$, to modulate the driving current $I_LD$. FIG. 8 compares the frequency dependence of the driving current $I_LD$ for various drivers. In FIG. 8, the behavior for the comparative driver has an arrangement that the transistor $M_0$ in the high side driver is driven by only the emitter of the transistor $Q_0$ via the capacitor $C_0$ and the transistor $Q_2$ in the low side driver is driver by only the emitter of the transistor $Q_1$. In the driver 3a, resistors, $R_4$ and $R_5$, has resistance of 50 Ω, capacitors, $C_3$ and $C_4$, has capacitance of 300 fF. In the driver 3b, resistors, $R_4$ and $R_5$, has resistance of 60 Ω and capacitors, $C_3$ and $C_4$, has capacitance of 140 fF, and two delay lines, $D_0$ and $D_1$, have a delay of 2 pS. The frequency bandwidth of the comparative driver is 11.86 GHz, while, that of the driver 3a is 13.11 GHz, and that of the other driver 3b is 14.23 GHz. Thus, the drivers, 3a and 3b, according to embodiments of the invention may widen the frequency bandwidth the driving current $I_{LD}$ by 1.3 to 2.4 GHz.

The optical transmitter 1 thus described provides the driver 3 with the push-pull architecture driven to generate the driving current $I_{LD}$. The push-pull driver, because it is driven by the differential signal, the amplitude of the modulation signal and the power consumption may be suppressed; accordingly, the EMI (electro-magnetic interference) tolerance is reduced and the frequency bandwidth is widened. The trans-conductance (mA/V) of the driver can be enhanced without increasing the trans-conductance of the low side driver (the pull side driver); namely, without the degradation of the frequency bandwidth. Moreover, the high side driver (the push side driver) may enhance the trans-conductance of the driver, which can set the amplitude of the input signals relatively small. Accordingly, the EMI tolerance is suppressed, the high frequency response is enhanced, and the total power consumption is lowered.

Both the high side driver and the lower side driver may be complementarily driven, that is, the high side driver may be driven by the positive phase signal superposed with a signal with a phase opposite to the negative phase signal; while, the low side driver may be driven by the negative phase signal superposed with a signal with a phase opposite to the positive phase signal. Then, the driving signal applied to the high side driver and the low side driver may have a peaking to strengthen rising and falling edges.

While certain embodiments of the present invention have been illustrated with reference to specific combinations of elements, various other combinations may also be provided without departing from the teachings of the present invention. Thus, the present invention should not be construed as being limited to the particular exemplary embodiments described herein and illustrated in the figures, but may also encompass combinations of elements of the various illustrated embodiments.

What is claimed is:

1. A driver for providing a push current to a semiconductor laser diode (LD) and extracting a pull current from the LD, the driver being driven by a differential signal including a positive phase signal and a negative phase signal, comprising:
    a positive buffer configured to generate a first positive signal and a first negative signal from the positive phase signal;
    a negative buffer configured to generate a second positive signal and a second negative signal from the negative phase signal;
    a high side driver for generating the push current supplied to the LD, the high side driver being driven by the first positive signal superposed with the second positive signal; and
    a low side driver for generating the pull current extracted from the LD, the low side driver being driven by the second negative signal superposed with the first negative signal.

2. The driver of claim 1,
    wherein the high side driver provides a transistor driven by the first positive signal superposed with the second positive signal, and the low side driver provides a transistor driven by the second negative signal superposed with the first negative signal, the push transistor and the pull transistor being connected in series between a power supply and a ground, and wherein the LD is coupled with a node between two transistors.

3. The driver of claim 2, wherein the transistor in the high side driver is an n-type MOSFET and the transistor in the low side driver is an npn-type bipolar transistor.

4. The driver of claim 3, wherein the high side driver further includes a p-type MOSFET between the n-type MOSFET an the node, and wherein the push current is provided from a drain of the p-type MOSFET.

5. The driver of claim 4, wherein the n-type MOSFET, the p-type MOSFET, and the npn-type bipolar transistor are individually biased.

6. The driver of claim 1, wherein the positive buffer includes a bipolar transistor with abase receiving the positive phase signal, an emitter outputting the first positive signal, and a collector outputting the first negative signal, and wherein the negating buffer includes another bipolar transistor with a base receiving the negative phase signal, an emitter outputting the second negative signal, and a collector outputting the second positive signal.

7. The driver of claim 6, wherein the first positive signal and the second positive signal are provided to the high side driver via respective capacitors, and wherein the first negative signal and the second negative signal are provided to the low side driver via respective capacitors.

8. The driver of claim 6, further includes a high side emitter follower and a low side emitter follower, the high side emitter follower buffering the collector of the bipolar transistor in the positive buffer, the low side emitter follower buffering the collector of the bipolar transistor of the negating buffer.

9. The driver of claim 8, wherein the first positive signal output from the emitter of the bipolar transistor of the positive buffer is provided to the high side driver via a delay line, and the second negative signal output from the emitter of the bipolar transistor of the negative buffer is provided to the low side driver via another delay line.

10. The driver of claim 9, wherein the delay line has a delay substantially equal to a delay of the low side emitter follower, and another delay line has a delay substantially equal to a delay of the high side emitter follower.

* * * * *